United States Patent
Wang et al.

(10) Patent No.: US 7,571,369 B2
(45) Date of Patent: Aug. 4, 2009

(54) TURBO DECODER ARCHITECTURE FOR USE IN SOFTWARE-DEFINED RADIO SYSTEMS

(75) Inventors: Yan Wang, Plano, TX (US); Eran Pisek, Plano, TX (US); Jasmin Oz, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 662 days.

(21) Appl. No.: 11/225,479

(22) Filed: Sep. 13, 2005

(65) Prior Publication Data

US 2006/0184855 A1 Aug. 17, 2006

Related U.S. Application Data

(60) Provisional application No. 60/682,338, filed on May 18, 2005, provisional application No. 60/653,968, filed on Feb. 17, 2005.

(51) Int. Cl.
 *H03M 13/00* (2006.01)
(52) U.S. Cl. .................. 714/755; 714/786; 714/794; 714/795; 375/262; 375/265; 375/341
(58) Field of Classification Search ............... 714/755, 714/786, 794, 795; 375/262, 265, 341
See application file for complete search history.

(56) References Cited

U.S. PATENT DOCUMENTS 6,252,917 B1* 6/2001 Freeman ............... 375/340
6,526,538 B1* 2/2003 Hewitt .................. 714/780
2003/0106012 A1* 6/2003 Hewitt .................. 714/780
2006/0023815 A1* 2/2006 Malm ................... 375/340

OTHER PUBLICATIONS

Reuven Dobkin et al., "Parallel VLSI Architecture for MAP Turbo Decoder", VLSI Systems Research Center, Electrical Engineering Department, Technion—Israel Institute of Technology, Personal, Indoor and Mobile Radio Communications, 2002, vol. 1, Sep. 15-18, 2002, p. 384-388.
Reuven Dobkin et al., "Parallel VLSI Architecture for MAP Turbo Decoder", VLSI Systems Research Center, Electrical Engineering Department, Technion—Israel Institute of Technology.
James G. Harrison, "Implementation of a 3GPP Turbo Decoder on a Programmable DSP Core" 3DSP Corporation, Presented at the Communications Design Conference, San Jose, California, Oct. 2, 2001.

* cited by examiner

*Primary Examiner*—Guy J Lamarre

(57) ABSTRACT

A reconfigurable turbo decoder comprising N processing units. Each of the N processing units receives soft input data samples and decodes the received soft input data samples. The N processing units operate independently such that a first processing unit may be selected to decode the received soft input data samples while a second processing unit may be disabled. The number of processing units selected to decode the soft input data samples is determined by a data rate of the received soft input data samples. The reconfigurable turbo decoder also comprises N input data memories that store the received soft input data samples and N extrinsic information memories that store extrinsic information generated by the N processing units. Each of the N processing units is capable of reading from and writing to each of the N input data memories and each of the N extrinsic information memories.

40 Claims, 5 Drawing Sheets

TURBO DECODER ARCHITECTURE FOR USE IN SOFTWARE-DEFINED RADIO SYSTEMS

CROSS-REFERENCE TO RELATED APPLICATION AND CLAIM OF PRIORITY

This application is related to U.S. Provisional Patent No. 60/682,338, filed May 18, 2005, entitled "Turbo Code Decoder Architecture For Software-Defined Radio" and to U.S. Provisional Patent No. 60/653,968, filed Feb. 17, 2005, entitled "Context-Based Operation Reconfigurable Instruction Set Processor." U.S. Provisional Patent Nos. 60/682,338 and 60/653,968 are assigned to the assignee of this application and are incorporated by reference into this disclosure as if fully set forth herein. This application hereby claims priority under 35 U.S.C. §119(e) to U.S. Provisional Patent Nos. 60/682,338 and 60/653,968.

This application is related to U.S. patent application Ser. No. 11/123,313, filed on May 6, 2005, entitled "Context-based Operation Reconfigurable Instruction Set Processor and Method of Operation." Application Ser. No. 11/123,313 is assigned to the assignee of this application and is incorporated by reference into this application as if fully set forth herein.

TECHNICAL FIELD OF THE INVENTION

The present application relates generally to turbo decoders and, more specifically, to a turbo decoder implemented using a context-based operation reconfigurable instruction set processor (CRISP).

BACKGROUND OF THE INVENTION

Turbo coding is a powerful forward error correction (FEC) algorithm that achieves a coding gain close to the Shannon limit. Turbo encoders and turbo decoders have been adopted for use in the physical layers of a number of wireless standards, including WCDMA, CDMA2000, IEEE-802.16e (i.e., WiBro) and others. These standards operate at different data rates and implement turbo encoders and turbo decoders that are optimized for only one or two specific standards. Also, most conventional turbo encoders/decoders operate at relatively low data rates.

A software-defined radio (SDR) device uses reconfigurable hardware that may be programmed over-the-air to operate under different wireless standards. For example, an SDR transceiver in a wireless laptop computer or PDA may be configured by different software loads to operate in an IEEE-802.11x wireless network, a CDMA2000 wireless network, an OFDM/OFDMA wireless network, a GSM wireless network, or other types of networks. Many of these wireless standards require the use of turbo decoders.

However, conventional turbo decoders have significant drawbacks with respect to SDR applications. As noted above, conventional turbo decoders are optimized for decoding under only one or two specific standards. If an SDR device is required to support many wireless standards, more than one turbo decoder must be implemented in the SDR device. This leads to a complex transceiver design that makes inefficient use of chip space and has high power dissipation. Additionally, some of the newer wireless standards operate at relatively high data rates (e.g., WiBro, HSPDA, and the like). A turbo decoder that is optimized in terms of speed and power consumption for a low data rate standard is unlikely to be optimized in terms of speed and power consumption for a high data rate standard, and vice versa. Thus, conventional turbo decoder designs are not suitable for use in SDR applications.

Therefore, there is a need in the art for an improved reconfigurable turbo decoder for use in a software-defined radio (SDR) system.

SUMMARY OF THE INVENTION

A reconfigurable turbo decoder is provided. The reconfigurable turbo decoder comprises N processing units, wherein each of the N processing units receives soft input data samples and decodes the received soft input data samples. The N processing units operate independently such that a first one of the N processing units may be selected to decode the received soft input data samples while a second one of the N processing units may be disabled. The number of the N processing units that are selected to decode the received soft input data samples is determined by a data rate of the received soft input data samples.

In one embodiment, the reconfigurable turbo decoder further comprises N input data memories that store the received soft input data samples. Each of the N processing units is capable of reading data from and writing data to each one of the N input data memories.

In another embodiment, the reconfigurable turbo decoder further comprises N extrinsic information memories that store extrinsic information generated by the N processing units. Each of the N processing units is capable of reading extrinsic information from and writing extrinsic information to each one of the N extrinsic information memories.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

The reconfigurable turbo decoder disclosed herein provides a high degree of parallelism to support high data rate standards. The target downlink rate of WiBro is 12 Mbps and HSDPA achieves a peak data rate up to 14.4 Mbps. Also, a turbo decoder must perform several iterations to achieve optimal performance. The disclosed turbo decoder architecture uses parallelism to achieve the necessary throughput at high data rates.

The reconfigurable turbo decoder supports multimode operation for decoding in different communication standards, including WCDMA, CDMA2000, IEEE-802.16e (i.e., WiBro), among others. The disclosed turbo decoder also provides adaptability to support different data rates. WiBro and WCDMA/HSDPA operate at many different data rates. The disclosed turbo decoder architecture is optimized not only for the maximum data rates but also for different ranges of data rate.

The reconfigurable turbo decoder also minimizes power consumption for different standards and data rates, since the turbo decoder may be implemented in handheld devices. Finally, a reconfigurable turbo decoder according to the principles of the present disclosure provides flexibility to the end user. Although the design targets turbo decoding, the architecture does not require stringent parameter restrictions. Thus, the design provides a general maximum a posteriori (MAP) decoder platform that enables end users to select parameters and algorithms based on end-user requirements.

In one embodiment of the disclosure, the reconfigurable turbo decoder described herein may be implemented using a context-based operation reconfigurable instruction set processor (CRISP) device. CRISP devices are described in detail in U.S. patent application Ser. No. 11/123,313, which was incorporated by reference above.

Figure 1:
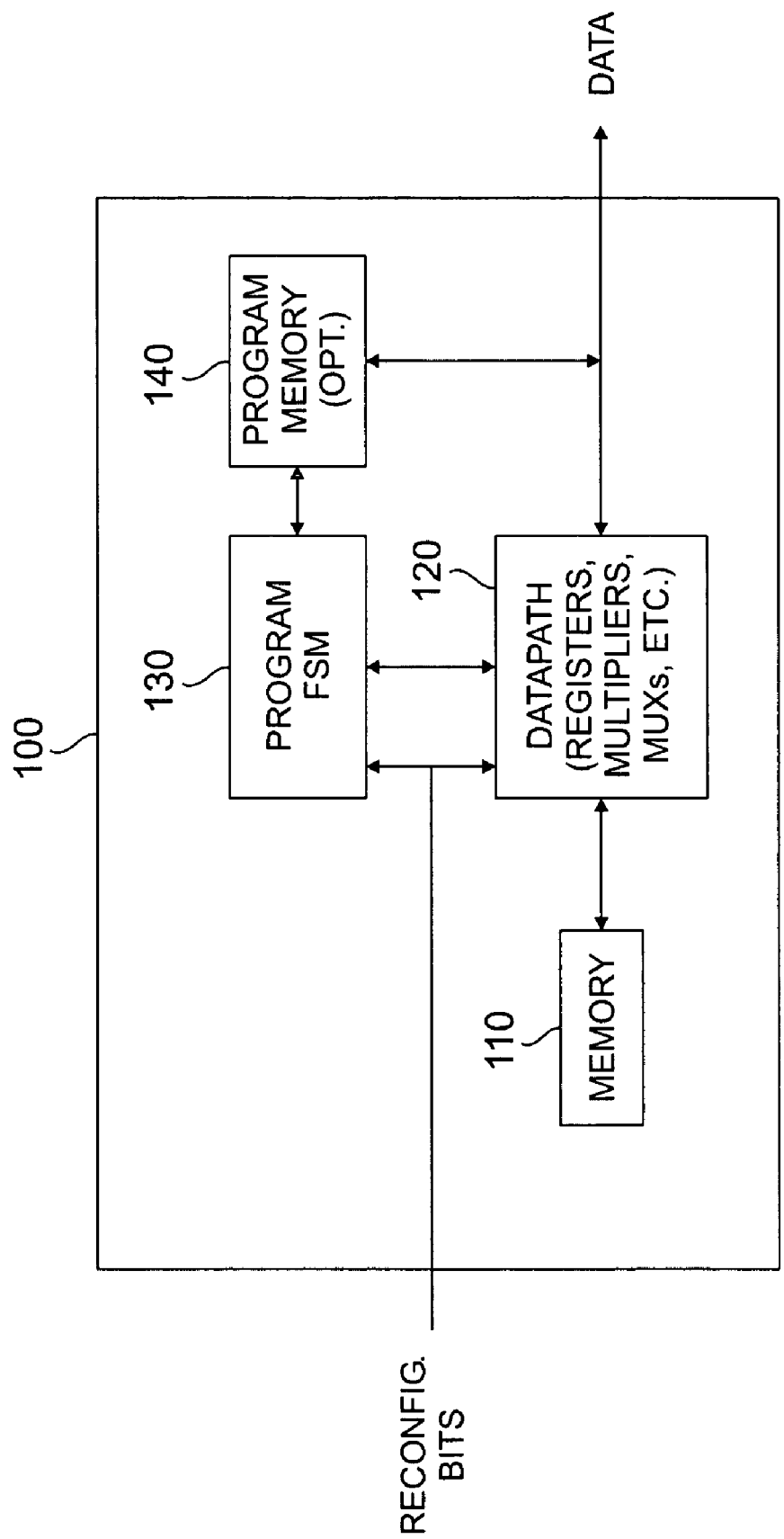
FIG. 1 is a high-level block diagram of a CRISP device that may be used to implement a reconfigurable turbo decoder.

FIG. 1 is a high-level block diagram of context-based operation reconfigurable instruction set processor (CRISP) 100, which may be used to implement a turbo decoder. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

Context-based operation reconfigurable instruction set processor (CRISP) 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
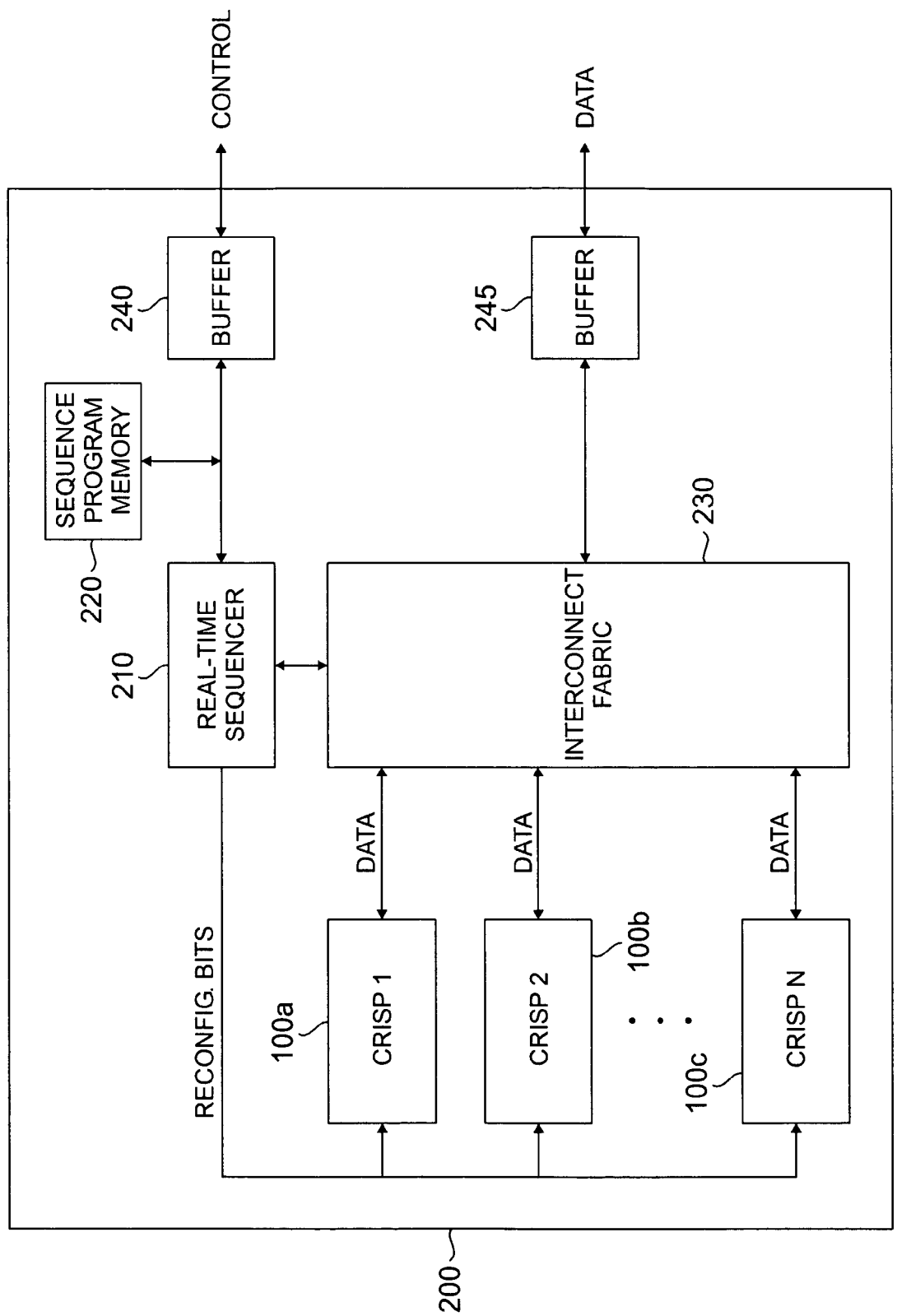
FIG. 2 is a high-level block diagram of a reconfigurable processing system.

FIG. 2 is a high-level block diagram of reconfigurable processing system 200 according to one embodiment of the present disclosure. Reconfigurable processing system 200 comprises N context-based operation reconfigurable instruction set processors (CRISPs), including exemplary CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In an exemplary embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In an exemplary embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In an exemplary embodiment, reconfigurable processing system 200 may be, for example, a cell phone or a similar wireless device, or a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
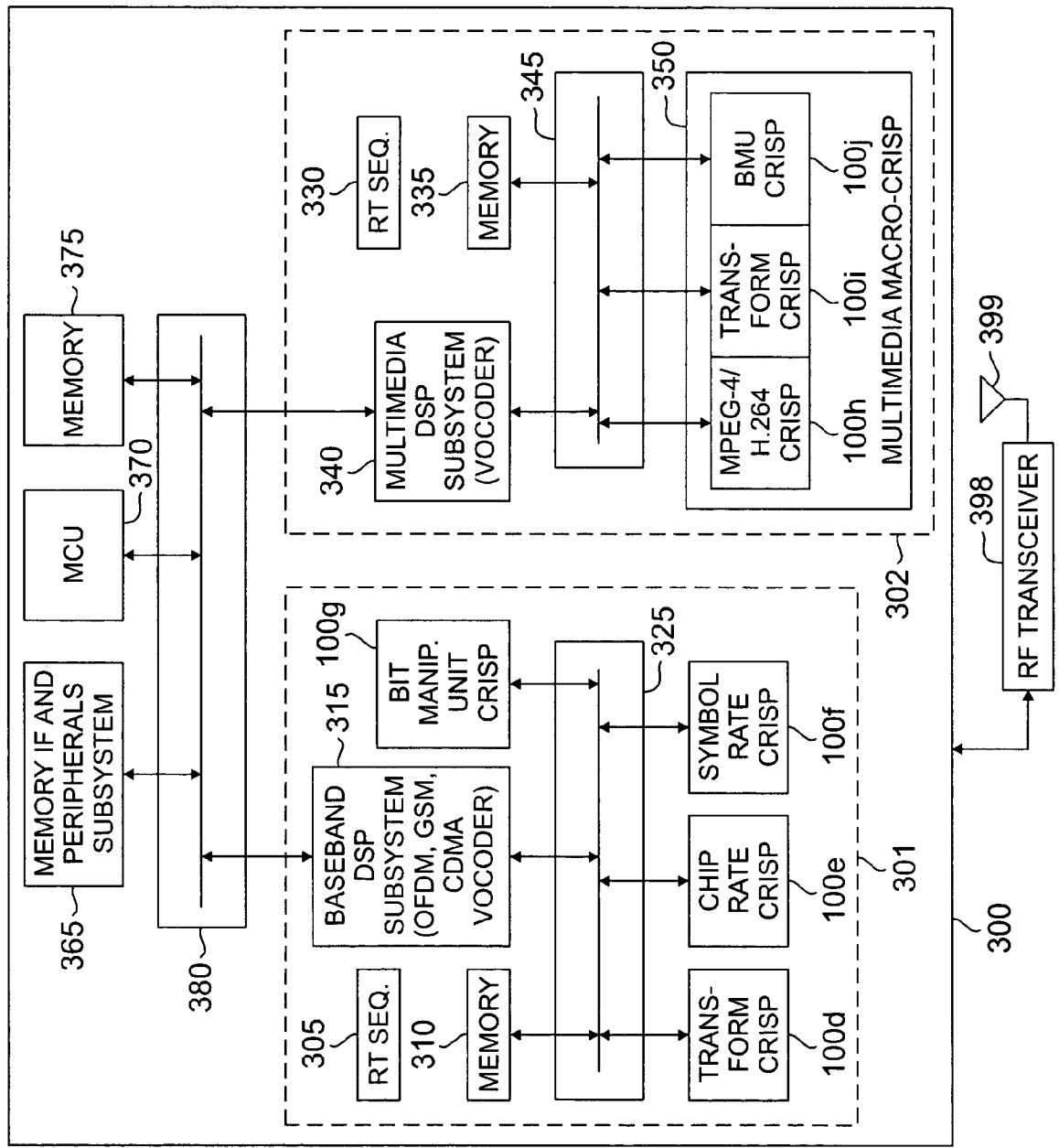
FIG. 3 is a high-level block diagram of a multi-standard software-defined radio (SDR) system that implements a reconfigurable turbo decoder using at least one CRISP device.

FIG. 3 is a high-level block diagram of multi-standard software-defined radio (SDR) system 300, which implements a reconfigurable turbo decoder using a CRISP device. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose context-based operation instruction set processors (CRISPs), including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an exemplary embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In an exemplary embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose context-based operation instruction set processors, including MPEG-4/H.264 CRISP 550h, transform CRISP 550i, and BMU CRISP 100j. In an exemplary embodiment of the disclosure, MPEG-4/H.264 CRISP 550h performs motion estimation functions and transform CRISP 100h performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4:
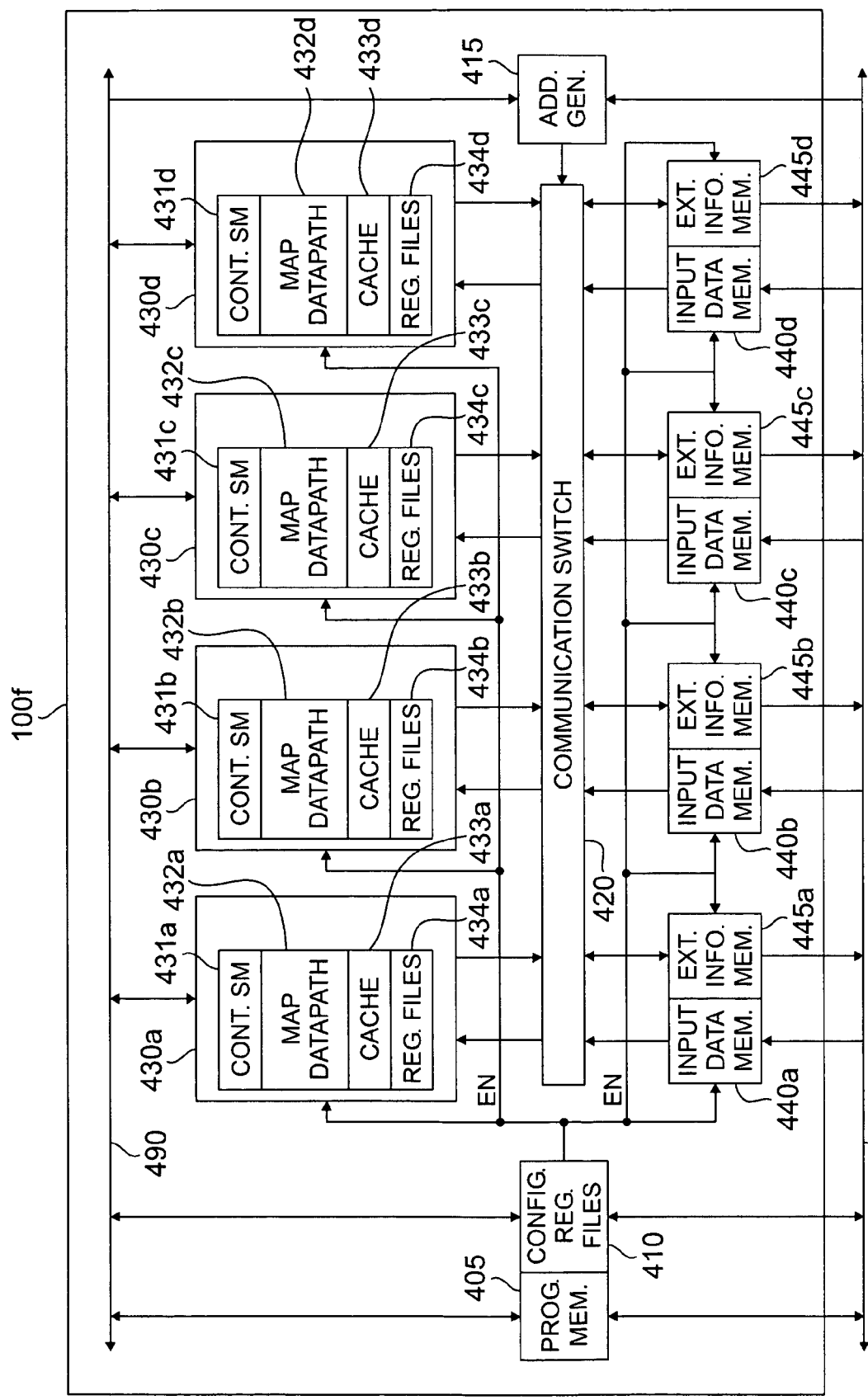
FIG. 4 is a block diagram of a reconfigurable turbo decoder implemented in a CRISP according to the principles of the disclosure.

FIG. 4 is a block diagram of a reconfigurable turbo decoder implemented in CRISP 100f according to the principles of the disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a maximum a-posteriori probability (MAP) datapath, a cache, and control register files. By way of example, processing unit 430 comprises control state machine 431a, MAP datapath 432a, cache 433a, and control register files 434a. Although four processing units 430 are illustrated in FIG. 4, this is by way of example only. Other embodiments of turbo decoder CRISP 100f may implement less than four processing units 430 or more than four processing units 430.

A general MAP turbo decoder architecture generally comprises two primary functional blocks: i) soft-input, soft-output (SISO) stages that implement an a-posteriori probability (APP) algorithm; and ii) an interleaver/deinterleaver that scrambles the data according to the interleaving rules followed by the encoder in the transmitting device. Other blocks are required for the implementation of the decoder such as a RAM (random-access memory) for storing data from each iteration of the decoder.

Turbo decoder CRISP 100f includes all the building blocks of a conventional MAP turbo decoder. In an exemplary embodiment, MAP datapaths 432a-432d implement a sliding window MAP algorithm. However, alternate embodiments of turbo decoder CRISP 100f may implement non-sliding window MAP algorithms.

As is well known, a conventional turbo encoder uses two constituent encoders. A first encoder receives an original bit stream and generates a first parity bit stream. A second encoder receives an interleaved copy of the original bit stream and generates a second parity bit stream. The data transmitted by the turbo encoder comprises the original bit stream, the first parity bits from the first encoder, and the second parity bits from the second encoder.

A conventional turbo decoder comprises two decoder blocks that operate in an iterative fashion. A first decoder block receives data samples (soft values) from the demodulator corresponding to the original data bits and the first parity bits from the first encoder. The first decoder block uses the original data bits and the first parity bits to estimate the probability that the value of each original data bit is a 1 or a 0. A second decoder block receives data samples (soft values) from the demodulator corresponding to the interleaved original data bits, the second parity bits from the second encoder, and the probability estimates from the first decoder block. The process of decoding by both decoder blocks comprises one iteration of a turbo decoder. A conventional turbo decoder may perform a fixed number of iterations or may perform iterations until some external mechanism determines that additional iterations will not improve the bit error rate (BER) for a particular data frame. A hard decision is then made on the last soft outputs to determine the original data bits.

As is well known, a MAP algorithm is a trellis decoding algorithm, similar to the Viterbi algorithm. The MAP algorithm within the two decoder blocks operates on soft inputs (i.e., the demodulator outputs and the probability estimates) and produces soft outputs. The computations for a MAP algorithm performed by one decoder block for one iteration may be summarized as follows. In a first step, a conventional MAP algorithm computes and stores branch metrics called gamma (or $\gamma$) values for all branches of the trellis. The branch metrics are the exponentials of the negatives of the distances between the hard encoder values and the soft received values from the demodulator, divided by the channel noise variance, times the probability estimate from the previous decoder.

In a second step, the conventional MAP algorithm performs a forward recursion on the trellis. The forward recursion computes an alpha (or $\alpha$) value for each node in the trails. The $\alpha$ value is the sum of i) the previous a value times the branch metric along one branch from a previous node and ii) the previous a value times the branch metric along another branch from a previous node. In a third step, the conventional MAP algorithm performs a backward recursion on the trellis. The backward recursion computes a beta (or $\beta$) value for each node in the trails. The $\beta$ values are computed in a manner similar to the $\alpha$ values, except that the backward recursion starts at the end of the trellis and progresses in the reverse direction.

In a fourth step, the conventional MAP algorithm computes the log likelihood ratio (LLR or $\lambda$) value for each time t. This value is the sum of the products of the $\alpha$, $\beta$, and $\lambda$ values for each branch at time t that is associated with a 1 value in the encoder, divided by the sum of the products of the $\alpha$, $\beta$, and $\lambda$ values for each branch at time t that is associated with a 0 value in the encoder. Finally, the conventional MAP algorithm computes the extrinsic information that is to be sent to the next decoder in the iteration sequence. The extrinsic information is the LLR value minus the input probability estimate.

The computations described above are repeated in each iteration by each of the two decoder blocks. After all iterations are completed, the decoded information bits may be detected by examining the sign bit of the LLR value. If the LLR value is positive, the data bit is a 1. If the LLR value is negative, the data bit is a 0. Alternatively, the LLR values may be output to an external device that makes a decision on each data bit.

In turbo decoder CRISP 100*f*, the computations described above are performed by MAP datapaths 432*a*, 432*b*, 432*c* and 432*d*. The values of $\alpha$, $\beta$, and $\lambda$ are temporarily stored in caches 433*a*, 433*b*, 433*c*, and 433*d*. The extrinsic information from each iteration for each decoding block is stored in extrinsic information memories 445*a*, 445*b*, 445*c* and 445*d* via communication switch 420.

In an exemplary embodiment, MCU 370 loads a configuration program and configuration data into turbo decoder CRISP 100*f* via an external system bus (i.e., interconnect 325). The configuration program is stored in program memory 405. MCU 370 loads the configuration data into configuration register files 410 and control register files 434*a*-434*d* in order to initialize the register files. Configuration register files 410 and control register files 434*a*-434*d* are used to control which processing units 430*a*-430*d*, input data memories 440*a*-440*d*, and extrinsic information memories 445*a*-445*d* are used in an application. Configuration register files 410 provide enable (EN) signals to control processing units 430, input data memories 440, and extrinsic information memories 445. Turbo decoder CRISP 100*f* reads input data samples and writes decoded output data via the system bus (i.e., interconnect 325).

In order to achieve high decoding rates, turbo decoder CRISP 100*f* implements N parallel processing units 430*a*-430*d*. In this example, N=4. Processing units 430*a*-430*d* are independent and identical to each other. Each one of processing units 430*a*-430*d* is capable of connecting to each one of input data memories 440*a*-440*d* and extrinsic information memories 445*a*-445*d* via communication switch 420. For higher data rate standards, all of processing units 430*a*-430*d* may operate simultaneously and in parallel. For lower data rate standards, one or more of processing units 430*a*-430*d* may be set to a sleep mode (i.e., deactivated or disabled) in order to reduce power consumption.

As noted above, each one of processing units 430*a*-430*d* comprises control state machine 431, MAP datapath 432, cache 433 and control register files 434. In an exemplary embodiment of turbo decoder CRISP 100*f*, each processing unit 430 processes two soft input data samples at a time. The two soft input data samples correspond to two data symbols. In an exemplary embodiment, each soft input data sample may comprise 8 bits.

MAP datapath 432 performs both forward and backward recursions over the trellis. During the forward recursion, both the input symbol and the extrinsic information must be accessed to compute the branch metric, $\gamma$. In order to reduce memory access power consumption, the $\gamma$ value may be computed and stored in cache 433 in each processing unit 430. If the values of $\alpha$, $\beta$, and $\lambda$ are not calculated simultaneously, the $\alpha$ value may also be stored in cache 430 to reduce data movement and power consumption.

MAP datapath 432 may compute the $\alpha$, $\beta$, and $\lambda$ values in parallel or in consecutive (or sequential) order. Parallel execution is faster, but requires more die space and power consumption. Consecutive processing incurs longer delays, but requires less die space and less power consumption. In an exemplary embodiment, each one of MAP datapaths 430*a*-430*d* computes the $\alpha$, $\beta$, and $\lambda$ values sequentially.

Control state machine 431 decodes instructions from program memory received via internal bus 490 and controls the overall operation and configuration of processing unit 430. Since turbo decoder CRISP 100*f* may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information generated in each iteration of the turbo decoder. The eight memory blocks are divided into four groups. Each memory group includes one input data memory 440 and one extrinsic information memory 445. By way of example, input data memory 440a and extrinsic information memory 445a form a first memory group, input data memory 440b and extrinsic information memory 445b form a second memory group, and so forth.

Each one of processing units 430a-430d reads and writes to one memory group at a time. Each one of processing units 430a-430d is capable of writing to each one of the memory groups. Thus, none of the memory groups is dedicated to a specific processing unit 430. For example, processing unit 430a may be connected by communication switch 420 to a first memory group (e.g., memories 440a and 445a) during one memory cycle and may read from or write to another memory group (e.g., memories 440c and 445c) during another memory cycle.

Communication switch 420 dynamically controls the connections between processing units 430a-430d and the memory groups comprised of memories 440a-440d and memories 445a-445d. The connection order or pattern is determined by the operation of address generator 415. In one embodiment of the present disclosure, address generator 415 may be implemented by a memory. In such an embodiment, the external control DSP/MCU, such as MCU 370, pre-computes offline the interleaver pattern of the turbo decoder and writes the interleaver pattern to the memory of address generator 415 during an initialization phase. In another embodiment of the present disclosure, address generator 415 may be designed to generate the interleaver pattern in real time.

Figure 5:
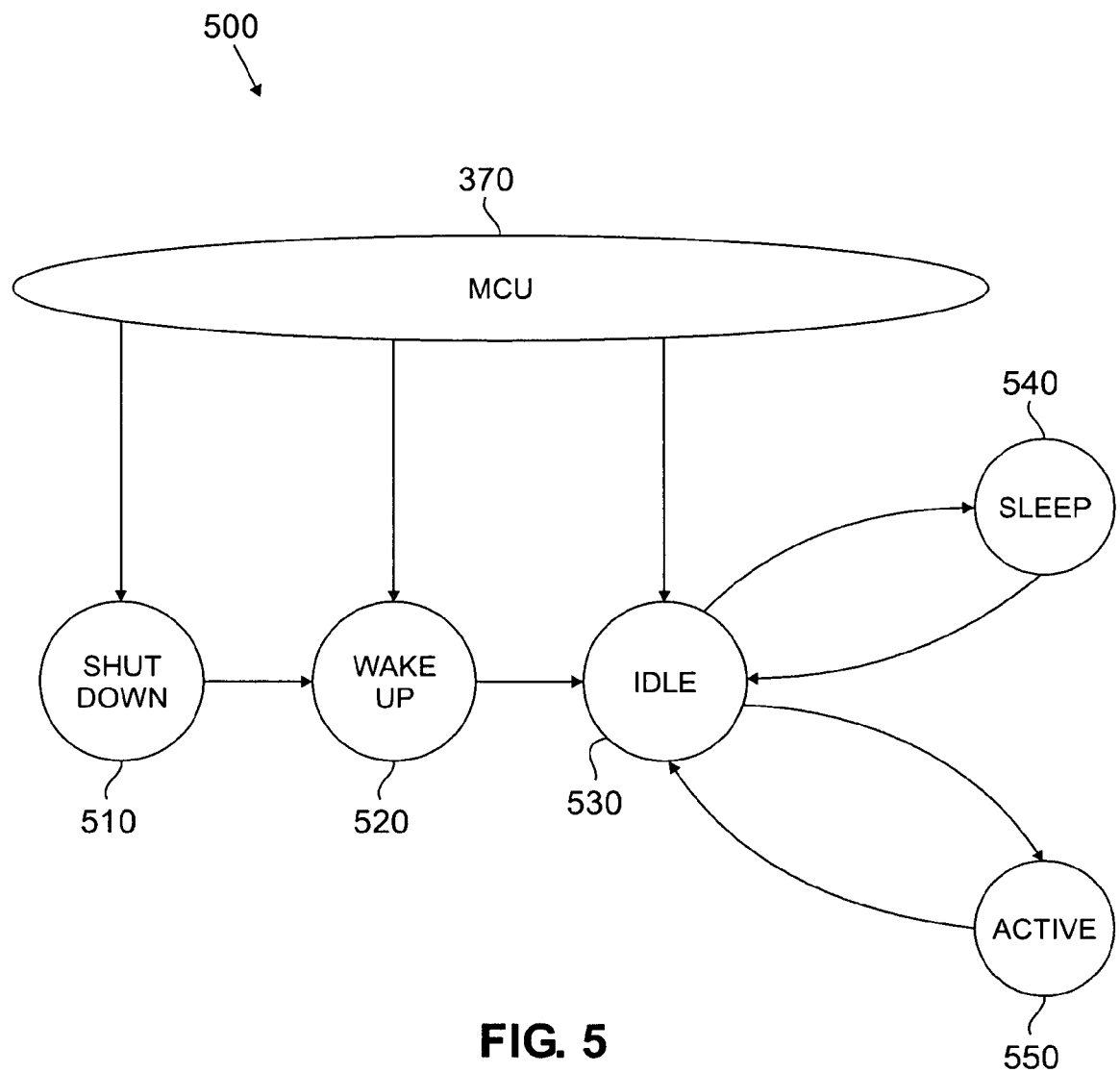
FIG. 5 is a state diagram illustrating the power management operations in a reconfigurable turbo decoder CRISP according to the principles of the present disclosure.

FIG. 5 depicts state diagram 500, which illustrates the power management operations in turbo decoder CRISP 100f according to the principles of the present disclosure. In an exemplary embodiment, turbo decoder CRISP 100f operates in several power management modes under the control of MCU 370, namely shut down mode 510, wake up mode 520, idle mode 530, sleep mode 540 and active mode 550. In an alternate embodiment, turbo decoder CRISP 100f may operate in different power management modes under the control of baseband DSP subsystem 315.

In shut down mode 510, turbo decoder CRISP 100f is completely shut down and all clocks are turned off. In wake up mode 520, program memory 405 is loaded and configuration register files 410 and control register files 434 are configured. However, clock signals are connected only to program memory 405, register files 410 and 434, and related circuits. In idle mode 530, clock signals are supplied to processing units 430a-430d and some memory groups are turned on so that the memory groups may receive input data samples. In sleep mode 550, the clock signals supplied to processing units 430a-430d, address generator 415, and some memory groups are gated. In active mode 550, turbo decoder CRISP 100f operates normally. In active mode 550, the only power management technique used is the scaling of the operating clock frequency.

At system reset, turbo decoder CRISP 100f is in shutdown mode 510. Once MCU 370 loads the configuration program and data into program memory 405, configuration register files 410, and/or control register files 434a-434d, the state of turbo decoder CRISP 100f is changed to wakeup mode 520, at which point only program memory 405, configuration register files 410, and/or control register files 434a-434d and related circuits are activated.

Once turbo decoder CRISP 100f finishes processing a frame of data, it is set to idle mode 530. In idle mode 530, turbo decoder CRISP 100f may receive input data samples from an external bus (i.e., interconnect 325). Once the input data is completely loaded into input data memories 440a-440d, turbo decoder CRISP 100f re-enters active mode 550 and resumes processing.

If some of processing units 430, input data memories 440a-440d, and extrinsic information memories 445a-445d are not in use, the clock signals to those components may be turned off to put those components into sleep mode 540. Processing units 430, input data memories 440a-440d, and extrinsic information memories 445a-445d that are in use remain in active mode 550. This scheme reduces power. If a processing unit is in use, but for period of time no instruction is executing, a NOP instruction may be inserted either manually or automatically. The NOP instruction activates only a minimal amount of hardware. This also reduces power consumption when the processing unit is in active mode 550.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A reconfigurable turbo decoder comprising:
N processing units, each of the N processing units capable of receiving soft input data samples and decoding the received soft input data samples, wherein the N processing units operate independently such that a first one of the N processing units may be selected to decode the received soft input data samples while a second one of the N processing units may be disabled.

2. The reconfigurable turbo decoder as set forth in claim 1, wherein a number of the N processing units that are selected to decode the received soft input data samples is determined by a data rate of the received soft input data samples.

3. The reconfigurable turbo decoder as set forth in claim 1, further comprising N input data memories capable of storing the received soft input data samples, wherein each of the N processing units is capable of reading data from and writing data to each one of the N input data memories.

4. The reconfigurable turbo decoder as set forth in claim 3, wherein the N input data memories operate independently such that a first one of the N input data memories may be selected to store at least some of the received soft input data samples while a second one of the N input data memories may be disabled.

5. The reconfigurable turbo decoder as set forth in claim 4, wherein a number of the N input data memories that are selected to store at least some of the received soft input data samples is determined by a data rate of the received soft input data samples.

6. The reconfigurable turbo decoder as set forth in claim 3, further comprising N extrinsic information memories capable of storing extrinsic information generated by the N processing units, wherein each of the N processing units is capable of reading extrinsic information from and writing extrinsic information to each one of the N extrinsic information memories.

7. The reconfigurable turbo decoder as set forth in claim 6, wherein the N extrinsic information memories operate independently such that a first one of the N extrinsic information memories may be selected to store at least some of the extrinsic information generated by the N processing units while a second one of the N extrinsic information memories may be disabled.

8. The reconfigurable turbo decoder as set forth in claim 7, wherein a number of the N extrinsic information memories that are selected to store at least some of the extrinsic information generated by the N processing units is determined by a data rate of the received soft input data samples.

9. The reconfigurable turbo decoder as set forth in claim 6, wherein the N processing units are coupled to the N input data memories and the N extrinsic information memories by a communication switch.

10. A software-defined radio (SDR) system capable of operating under a plurality of wireless communication standards, the SDR system comprising:
a radio frequency (RE) transceiver capable of receiving an incoming RE signal and generating a down-converted signal; and
a reconfigurable turbo decoder capable of receiving soft input data samples associated with the down-converted signal, the reconfigurable turbo decoder comprising:
N processing units, each of the N processing units capable of receiving the soft input data samples and decoding the received soft input data samples, wherein the N processing units operate independently such that a first one of the N processing units may be selected to decode the received soft input data samples while a second one of the N processing units may be disabled.

11. The software-defined radio (SDR) system as set forth in claim 10, wherein a number of the N processing units that are selected to decode the received soft input data samples is determined by a data rate of the received soft input data samples.

12. The software-defined radio (SDR) system as set forth in claim 10, wherein the reconfigurable turbo decoder further comprises N input data memories capable of storing the received soft input data samples, wherein each of the N processing units is capable of reading data from and writing data to each one of the N input data memories.

13. The software-defined radio (SDR) system as set forth in claim 12, wherein the N input data memories operate independently such that a first one of the N input data memories may be selected to store at least some of the received soft input data samples while a second one of the N input data memories may be disabled.

14. The software-defined radio (SDR) system as set forth in claim 13, wherein a number of the N input data memories that are selected to store at least some of the received soft input data samples is determined by a data rate of the received soft input data samples.

15. The software-defined radio (SDR) system as set forth in claim 12, wherein the reconfigurable turbo decoder further comprises N extrinsic information memories capable of storing extrinsic information generated by the N processing units, wherein each of the N processing units is capable of reading extrinsic information from and writing extrinsic information to each one of the N extrinsic information memories.

16. The software-defined radio (SDR) system as set forth in claim 15, wherein the N extrinsic information memories operate independently such that a first one of the N extrinsic information memories may be selected to store at least some of the extrinsic information generated by the N processing units while a second one of the N extrinsic information memories may be disabled.

17. The software-defined radio (SDR) system as set forth in claim 16, wherein a number of the N extrinsic information memories that are selected to store at least some of the extrinsic information generated by the N processing units is determined by a data rate of the received soft input data samples.

18. The software-defined radio (SDR) system as set forth in claim 17, wherein the N processing units are coupled to the N input data memories and the N extrinsic information memories by a communication switch.

19. A method of operating a reconfigurable turbo decoder comprising N independent processing units capable of decoding received soft input data samples, the method comprising the steps of:
selecting at least one of the N processing units to receive soft input data samples;
decoding at least some of the received soft input data samples in the selected at least one processing unit; and
disabling at least one of the N processing units while the selected at least one processing units decodes received soft input data samples.

20. The reconfigurable turbo decoder as set forth in claim 19, wherein a number of the N processing units that are selected to decode the received soft input data samples is determined by a data rate of the received soft input data samples.

21. A maximum a-posteriori probability (MAP) algorithm execution unit comprising:
N processing units, each of the N processing units capable of receiving soft input data samples and decoding the received soft input data samples, wherein the N processing units operate independently such that a first one of the N processing units may be selected to decode the received soft input data samples while a second one of the N processing units may be disabled.

22. The MAP algorithm execution unit as set forth in claim 21, wherein a number of the N processing units that are selected to decode the received soft input data samples is determined by a data rate of the received soft input data samples.

23. The MAP algorithm execution unit as set forth in claim 21, further comprising N input data memories capable of storing the received soft input data samples, wherein each of the N processing units is capable of reading data from and writing data to each one of the N input data memories.

24. The MAP algorithm execution unit as set forth in claim 23, wherein the N input data memories operate independently such that a first one of the N input data memories may be selected to store at least some of the received soft input data samples while a second one of the N input data memories may be disabled.

25. The MAP algorithm execution unit as set forth in claim 24, wherein a number of the N input data memories that are selected to store at least some of the received soft input data samples is determined by a data rate of the received soft input data samples.

26. The MAP algorithm execution unit as set forth in claim 23, further comprising N extrinsic information memories capable of storing extrinsic information generated by the N processing units, wherein each of the N processing units is capable of reading extrinsic information from and writing extrinsic information to each one of the N extrinsic information memories.

27. The MAP algorithm execution unit as set forth in claim 26, wherein the N extrinsic information memories operate independently such that a first one of the N extrinsic information memories may be selected to store at least some of the extrinsic information generated by the N processing units while a second one of the N extrinsic information memories may be disabled.

28. The MAP algorithm execution unit as set forth in claim 27, wherein a number of the N extrinsic information memories that are selected to store at least some of the extrinsic information generated by the N processing units is determined by a data rate of the received soft input data samples.

29. The MAP algorithm execution unit as set forth in claim 26, wherein the N processing units are coupled to the N input data memories and the N extrinsic information memories by a communication switch.

30. A software-defined radio (SDR) system capable of operating under a plurality of wireless communication standards, the SDR system comprising:
a radio frequency (RF) transceiver capable of receiving an incoming RF signal and generating a down-converted signal; and
a reconfigurable maximum a-posteriori probability (MAP) algorithm execution unit capable of receiving soft input data samples associated with the down-converted signal, the reconfigurable MAP execution algorithm unit comprising:
N processing units, each of the N processing units capable of receiving the soft input data samples and decoding the received soft input data samples, wherein the N processing units operate independently such that a first one of the N processing units may be selected to decode the received soft input data samples while a second one of the N processing units may be disabled.

31. The software-defined radio (SDR) system as set forth in claim 30, wherein a number of the N processing units that are selected to decode the received soft input data samples is determined by a data rate of the received soft input data samples.

32. The software-defined radio (SDR) system as set forth in claim 30, wherein the reconfigurable MAP algorithm execution unit further comprises N input data memories capable of storing the received soft input data samples, wherein each of the N processing units is capable of reading data from and writing data to each one of the N input data memories.

33. The software-defined radio (SDR) system as set forth in claim 32, wherein the N input data memories operate independently such that a first one of the N input data memories may be selected to store at least some of the received soft input data samples while a second one of the N input data memories may be disabled.

34. The software-defined radio (SDR) system as set forth in claim 33, wherein a number of the N input data memories that are selected to store at least some of the received soft input data samples is determined by a data rate of the received soft input data samples.

35. The software-defined radio (SDR) system as set forth in claim 32, wherein the reconfigurable MAP algorithm execution unit further comprises N extrinsic information memories capable of storing extrinsic information generated by the N processing units, wherein each of the N processing units is capable of reading extrinsic information from and writing extrinsic information to each one of the N extrinsic information memories.

36. The software-defined radio (SDR) system as set forth in claim 35, wherein the N extrinsic information memories operate independently such that a first one of the N extrinsic information memories may be selected to store at least some of the extrinsic information generated by the N processing units while a second one of the N extrinsic information memories may be disabled.

37. The software-defined radio (SDR) system as set forth in claim 36, wherein a number of the N extrinsic information memories that are selected to store at least some of the extrinsic information generated by the N processing units is determined by a data rate of the received soft input data samples.

38. The software-defined radio (SDR) system as set forth in claim 37, wherein the N processing units are coupled to the N input data memories and the N extrinsic information memories by a communication switch.

39. A method of operating a reconfigurable maximum a-posteriori probability (MAP) algorithm execution unit comprising N independent processing units capable of decoding received soft input data samples, the method comprising the steps of:
selecting at least one of the N processing units to receive soft input data samples;
decoding at least some of the received soft input data samples in the selected at least one processing unit; and
disabling at least one of the N processing units while the selected at least one processing units decodes received soft input data samples.

40. The method as set forth in claim 39, wherein a number of the N processing units that are selected to decode the received soft input data samples is determined by a data rate of the received soft input data samples.

* * * * *

UNITED STATES PATENT AND TRADEMARK OFFICE
CERTIFICATE OF CORRECTION

PATENT NO. : 7,571,369 B2  Page 1 of 1
APPLICATION NO. : 11/225479
DATED : August 4, 2009
INVENTOR(S) : Yan Wang et al.

It is certified that error appears in the above-identified patent and that said Letters Patent is hereby corrected as shown below:

Column 11, line 16, claim 10, delete "(RE)" and replace with --(RF)--; and

Column 11, line 17, claim 10, delete "RE" and replace with --RF--.

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,571,369 B2
APPLICATION NO. : 11/225479
DATED : August 4, 2009
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 987 days.

Signed and Sealed this

Seventh Day of September, 2010

David J. Kappos
*Director of the United States Patent and Trademark Office*